(12) United States Patent
Bhakta

(10) Patent No.: US 6,337,264 B2
(45) Date of Patent: *Jan. 8, 2002

(54) SIMPLIFIED METHOD OF PATTERNING POLYSILICON GATE IN A SEMICONDUCTOR DEVICE INCLUDING AN OXIME LAYER AS A MASK

(75) Inventor: Jayendra D. Bhakta, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/365,411

(22) Filed: Aug. 2, 1999

(51) Int. Cl.$^7$ ................. H01L 21/3205; H01L 21/4763; H01L 21/302; H01L 21/461

(52) U.S. Cl. ................. 438/585; 438/717; 438/947; 438/952

(58) Field of Search .................. 438/585, 636, 438/717, 736, 947, 952

(56) References Cited

U.S. PATENT DOCUMENTS 5,710,067 A * 1/1998 Foote et al.
5,963,841 A * 10/1999 Karisson et al.
5,972,760 A * 10/1999 Ju
5,977,601 A * 11/1999 Yang et al.

* cited by examiner

Primary Examiner—John F. Niebling
Assistant Examiner—Ron Pompey

(57) ABSTRACT

Polysilicon gates are formed with greater accuracy and consistency by depositing an antireflective layer of silicon oxime on the polysilicon layer before patterning. Embodiments also include depositing the polysilicon layer and the silicon oxime layer in the same tool.

11 Claims, 3 Drawing Sheets

US 6,337,264 B2

SIMPLIFIED METHOD OF PATTERNING POLYSILICON GATE IN A SEMICONDUCTOR DEVICE INCLUDING AN OXIME LAYER AS A MASK

RELATED APPLICATIONS

This application contains subject matter similar to subject matter disclosed in copending U.S. patent application Ser. No. 09/366,216, filed on Aug. 2, 1999, and copending U.S. patent application Ser. No. 09/365,407, filed on Aug. 2, 1999.

TECHNICAL FIELD

The present invention relates to a method of manufacturing a semiconductor device having accurate and uniform polysilicon gates and underlying gate oxides. The present invention is applicable to manufacturing high speed integrated circuits having submicron design features and high conductivity reliable interconnect structures.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

Devices built on the semiconductor substrate of a wafer must be isolated. Isolation is important in the manufacture of integrated circuits which contain a plethora of devices in a single chip because improper isolation of transistors causes current leakage which, in turn, causes increased power consumption leading to increased noise between devices.

In the manufacture of conventional complementary metal oxide semiconductor (CMOS) devices, isolation regions, called field dielectric regions, e.g., field oxide regions, are formed in a semiconductor substrate of silicon dioxide by local oxidation of silicon (LOCOS) or by shallow trench isolation (STI). A conductive gate, such as polysilicon, is also formed on the substrate, with a gate oxide layer in between.

A polysilicon layer is deposited on gate oxide. Thereafter, a patterned photoresist mask is formed on the polysilicon layer and the polysilicon layer - oxide layer is etched to form conductive gates with a gate oxide layer in between. Dielectric spacers are formed on sidewalls of the gate, and source/drain regions are formed on either side of the gate by implantation of impurities.

Photolithography is conventionally employed to transform complex circuit diagrams into patterns which are defined on the wafer in a succession of exposure and processing steps to form a number of superimposed layers of insulator, conductor and semiconductor materials. Scaling devices to smaller geometries increases the density of bits/chip and also increases circuit speed. The minimum feature size, i.e., the minimum line-width or line-to-line separation that can be printed on the surface, controls the number of circuits that can be placed on the chip and directly impacts circuit speed. Accordingly, the evolution of integrated circuits is closely related to and limited by photolithographic capabilities.

An optical photolithographic tool includes an ultraviolet (UV) light source, a photomask and an optical system. A wafer is covered with a photosensitive layer. The mask is flooded with UV light and the mask pattern is imaged onto the resist by the optical system. Photoresists are organic compounds whose solubility changes when exposed to light of a certain wavelength or x-rays. The exposed regions become either more soluble or less soluble in a developer solvent.

There are, however, significant problems attendant upon the use of conventional methodology to form conductive gates with gate oxide layers in between on a semiconductor substrate. For example, when a photoresist is formed on a highly textured surface such as polysilicon, and exposed to monochromatic radiation, undesirable standing waves are produced as a result of interference between the reflected wave and the incoming radiation wave. In particular, standing waves are caused when the light waves propagate through a photoresist layer down to the silicon nitride layer, where they are reflected back up through the photoresist.

These standing waves cause the light intensity to vary periodically in a direction normal to the photoresist, thereby creating variations in the development rate along the edges of the resist and degrading image resolution. These irregular refections make it difficult to control critical dimensions (CDs) such as linewidth and spacing of the photoresist and have a corresponding negative impact on the CD control of the conductive gates and gate oxide layers.

There are further disadvantages attendant upon the use of conventional methodologies. For example, distortions in the photoresist are further created during passage of reflected light through the polysilicon layer which is typically used as a hardmask for etching. Specifically, normal fluctuations in the thickness of the polysilicon layer cause a wide range of varying reflectivity characteristics across the polysilicon layer, further adversely affecting the ability to maintain tight CD control of the photoresist pattern and the resulting conductive gates and gate oxide layers.

Highly reflective substrates accentuate the standing wave effects, and thus one approach to addressing the problems associated with the high reflectivity of the silicon nitride layer has been to attempt to suppress such effects through the use of dyes and anti-reflective coatings below the photoresist layer. For example, an anti-reflective coating (ARC), such as a polymer film, has been formed directly on the polysilicon layer. The ARC serves to absorb most of the radiation that penetrates the photoresist thereby reducing the negative effects stemming from the underlying reflective materials during photoresist patterning. Unfortunately, use of an ARC adds significant drawbacks with respect to process complexity. To utilize an organic or inorganic ARC, the process of manufacturing the semiconductor chip must include a process step for depositing the ARC material, and also a step for prebaking the ARC before spinning the photoresist.

There exists a need for a cost effective, simplified processes enabling the formation of an ARC to prevent the negative effects stemming from the underlying reflective materials during photoresist patterning.

The present invention addresses and solves the problems attendant upon conventional multistep, time-consuming and complicated processes for manufacturing semiconductor devices utilizing an ARC.

DISCLOSURE OF THE INVENTION

An advantage of the present invention is an efficient cost-effective method of manufacturing a semiconductor device with accurately formed conductive gates and gate oxide layers.

Additional advantages of the present invention will be set forth in the description which follows, and in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

forming an oxide layer on a semiconductor substrate;

forming a polysilicon layer on the oxide layer in a chamber;

forming a silicon oxime coating on the polysilicon layer in the chamber; and forming a photoresist mask on the silicon oxime coating.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1A:
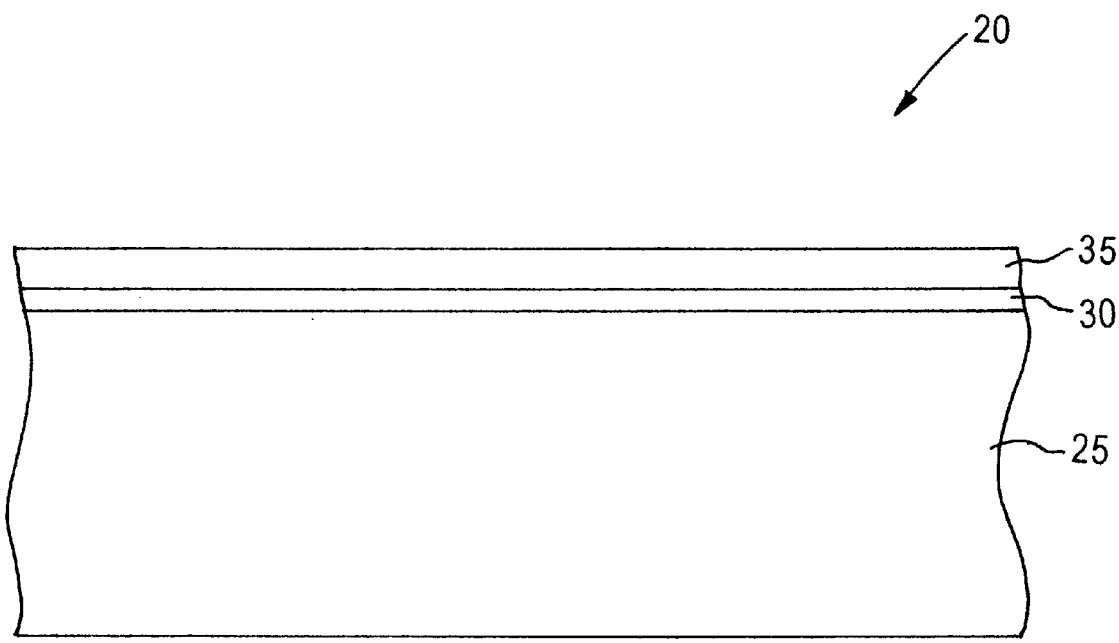
FIGS. 1A–1E schematically illustrate sequential phases of a method in accordance with an embodiment of the present invention.

The present invention addresses and solves problems stemming from conventional methodologies of forming polysilicon gates and underlying gate oxides. Such problems include costly and time-consuming steps limited by materials which require different deposition systems and apparatus.

The present invention constitutes an improvement over conventional practices in forming polysilicon gates and underlying gate oxides wherein a photoresist is formed on a highly reflective surface, such as polysilicon. The present invention enables the formation of polysilicon gates and underlying gate oxides with accurately controlled critical dimensions. In accordance with embodiments of the present invention, the semiconductor device can be formed by: forming an oxide layer on a semiconductor substrate; forming a polysilicon layer on the oxide layer in a chamber; forming a silicon oxime coating on the polysilicon layer in the chamber; and forming a photoresist mask on the silicon oxime coating. Embodiments of the present invention include forming the silicon oxime coating and the polysilicon layer in the same deposition chamber.

Interconnect members formed in accordance with embodiments of the present invention can be, but are not limited to, interconnects formed by damascene technology. Given the present disclosure and the objectives of the present invention, the conditions during which the polysilicon layer and the silicon oxime layer are formed can be optimized in a particular situation. For example, the invention can be practiced by forming the polysilicon layer by introducing a silicon tetrahydride ($SiH_4$) gas in a chamber at a temperature greater than about 600° C., such as about 620° C. to about 650° C. Thereafter, the temperature is reduced to about 400° C., such as about 350° C. to about 450° C. and a layer of silicon oxime is formed on the polysilicon layer in the same chamber. Given the stated objective, one having ordinary skill in the art can easily optimize the pressure, and gas flow as well as other process parameters for a given situation. It has been found suitable to maintain a gas flow of about 250 to about 350 SCCM, such as about 300 SCCM and a pressure of about 100 to about 300 mTorr, such as about 200 mTorr, during deposition of the polysilicon layer. Thereafter, source gases for the components, i.e., silicon, nitrogen, oxygen and hydrogen, are reacted under dynamic conditions employing a stoichiometric excess amount of nitrogen, sufficient to substantially prevent oxygen atoms from reacting with silicon atoms. It has been found further suitable to introduce $SiH_4$ gas at about 50 SCCM, to introduce $N_2$ gas at about 400 SCCM, to introduce $N_2O$ gas at about 40 SCCM, with remote plasma on, at a pressure of about 4 Torr and a power of about 150 W and a temperature of about 400° C. during deposition of the silicon oxime layer. Thus, an effective antireflective coating of silicon oxime is formed by an elegantly simplified, cost-effective technique of forming both the polysilicon layer and the silicon oxime layer in the same chamber.

An embodiment of the present invention is schematically illustrated in FIGS. 1A–1E. Adverting to FIG. 1A, a wafer 20 comprising a semiconductor substrate 25, such as silicon, is provided. A barrier layer 30, comprising an oxide, e.g. silicon dioxide, is deposited on the substrate, as by subjecting the wafer to an oxidizing ambient at elevated temperature. Embodiments of the present invention comprise forming the oxide layer to a thickness of about 100 Å to about 200 Å.

With continued reference to FIG. 1A, an polysilicon layer 35 is deposited on the silicon dioxide layer 30 by placing the oxidized substrate in a chamber. The polysilicon layer 35 is formed by introducing a $SiH_4$ gas in a plasma deposition chamber at 300 SCCM at a pressure of about 200 mTorr and a temperature of about 620° C. Embodiments of the present invention comprise forming the polysilicon layer to a thickness of about 1200 Å to about 1600 Å.

Figure 1B:
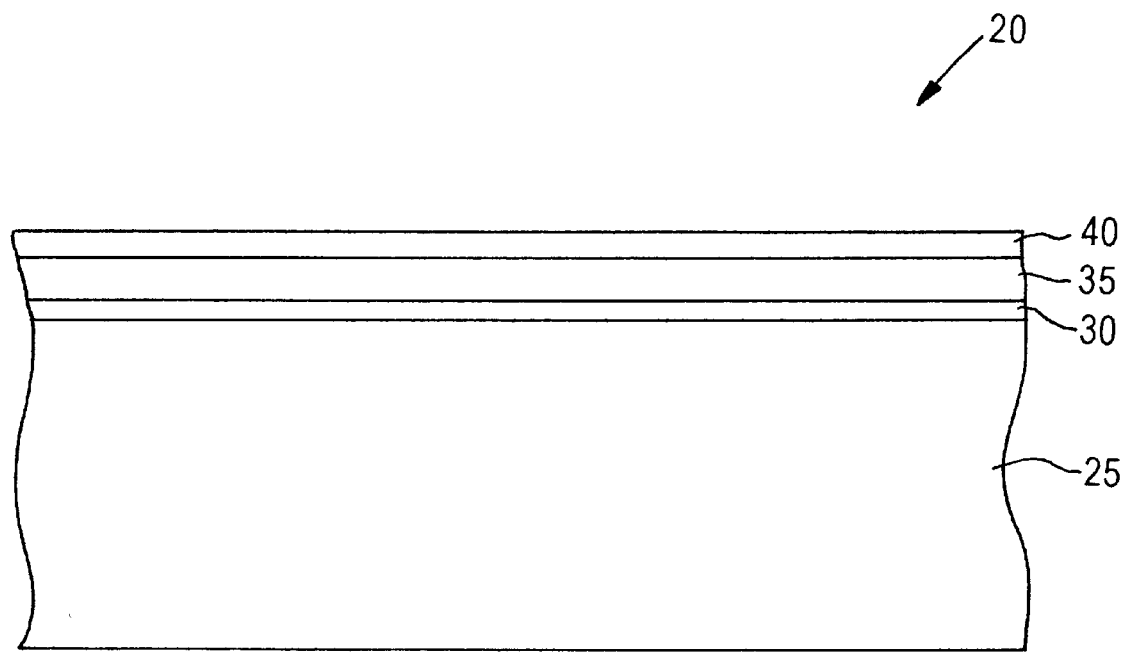

With reference to FIG. 1B, an silicon oxime layer 40 is formed on the polysilicon layer 35, as by reducing the temperature to about 530°. The silicon oxime layer 40 can be formed to a thickness of about 100 Å to about 600 Å. The silicon oxime layer 40 has an extinction coefficient (k) greater than about 0.4, such as about 0.4 to about 0.6, thereby permitting tighter critical dimension control during patterning of the photoresist and tighter critical dimension control of the polysilicon gate and gate oxide, subsequently formed on the substrate 25. The tighter critical dimension control is possible since the silicon oxime layer 40 absorbs a large percentage of the reflected light and thus prevents a non-uniform distribution of reflected light which may otherwise be incident on the photoresist during photolithography patterning.

Figure 1C:
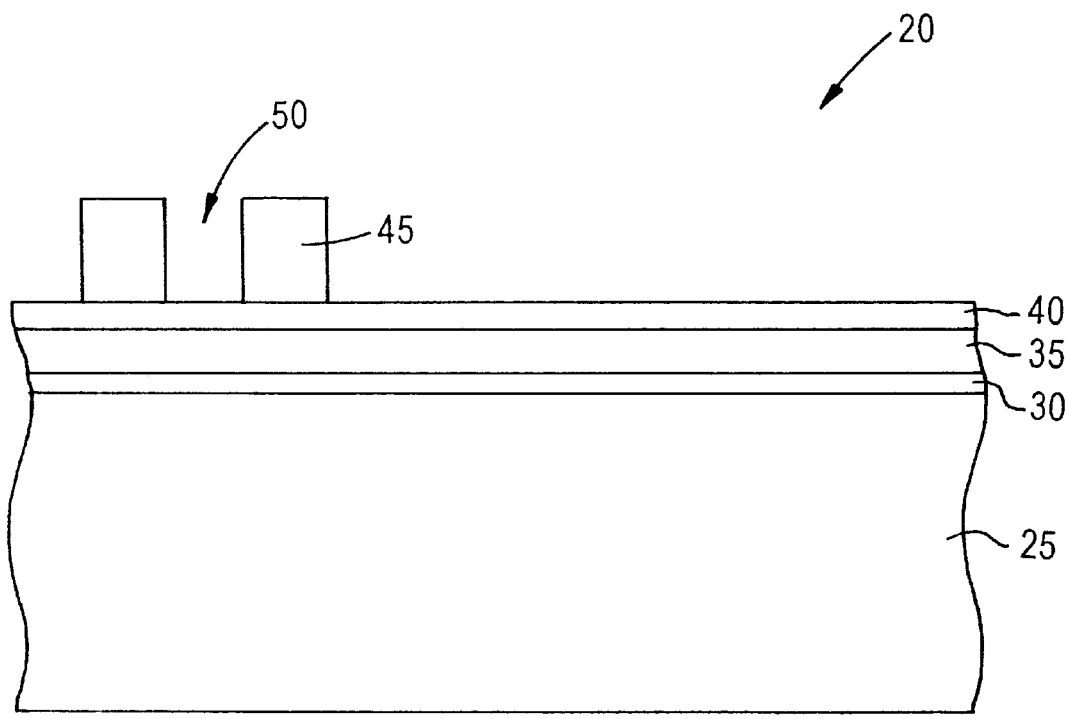

Referring to FIG. 1C, a photoresist mask 45 is formed on the silicon oxime layer 40. Photoresist mask 45 can comprise any of a variety of conventional photoresist materials which are suitable to be patterned using photolithography. With continued reference to FIG. 1C, the photoresist mask 45 is patterned and holes 50 are formed in the photoresist mask 45 to provide an opening through which etching of the exposed silicon oxime layer 40, polysilicon layer 35 and silicon dioxide layer 30 may take place. If critical dimensions, such as a line width and spacing, of the holes 50 in the photoresist mask 45 are not closely controlled, distortions occurring in forming the hole affect the dimensions of the polysilicon gate and gate oxide ultimately formed on the substrate 25. As mentioned above, such distortions in patterning the photoresist mask 45 occur in conventional methodologies as a result of the high reflectivity of the polysilicon layer 35 and the thickness variations in the polysilicon layer and cause nonuniform photo-reflectivity. The silicon oxime layer 40 of the present invention substantially absorbs light reflected back through the polysilicon layer 35, thereby reducing incident light on the photoresist mask 45 and preventing fluctuations which would otherwise occur in the critical dimensions of the holes 50 in the photoresist mask 45.

Figure 1D:
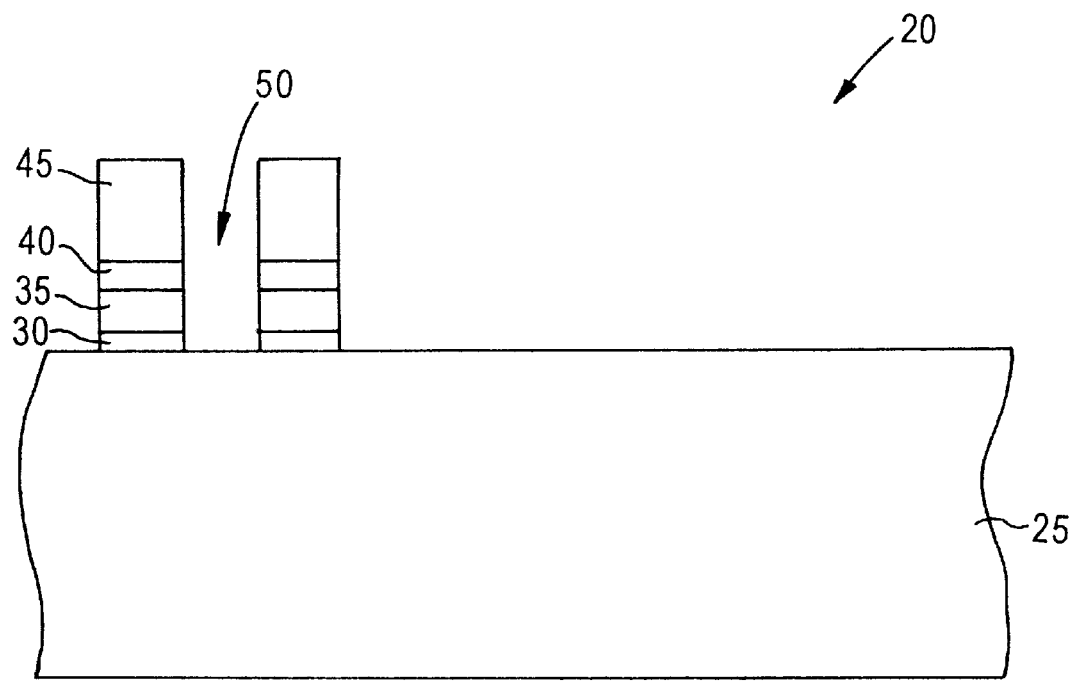

Adverting to FIG. 1D, conventional plasma etching of the silicon oxime layer 40, the polysilicon layer 35, and the silicon oxide layer 30 is conducted to strip them from the wafer. The plasma etching may occur in a single step or consecutive plasma etching steps.

Figure 1E:
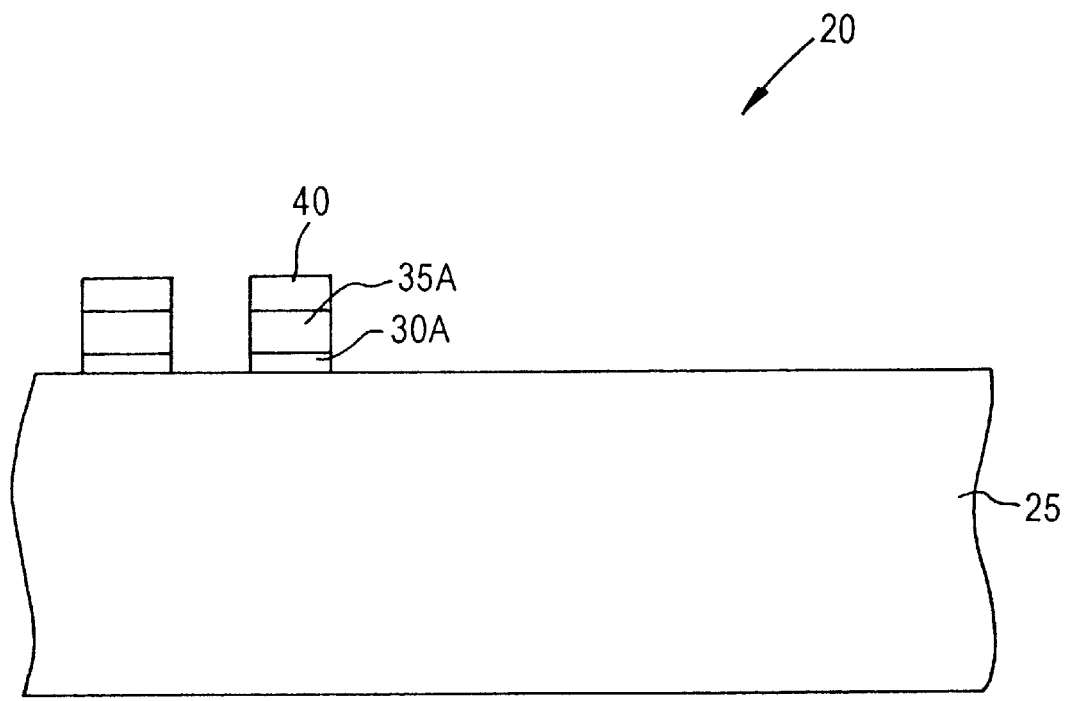

Referring to FIG. 1E, the photoresist mask 45 and optionally, the underlying silicon oxime layer 40 are stripped from the wafer (not shown), utilizing conventional etching techniques. With continued reference to FIG. 1E, a conductive polysilicon gate 35A remains on substrate 25 with a gate oxide layer 30A in between. At this point, the wafer continues to the next stage in the overall manufacturing process. Subsequent conventional processing steps, though not illustrated, typically include; forming dielectric spacers on sidewalls of the gate; and forming source/drain regions on either side of the gate by implantation of impurities.

In accordance with the present invention, metallization structures are formed in an elegantly simplified, efficient and cost-effective manner. Advantageously, the silicon oxime antireflective layer prevents the formation of standing waves and the negative effects stemming therefrom during photoresist patterning. The silicon oxime antireflective layer formed in accordance with the present invention is particularly advantageous in forming metallization interconnection patterns, particularly in various types of semiconductor devices having sub-micron features and high aspect ratios.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:
   forming an oxide layer on a semiconductor substrate;
   forming a polysilicon layer on the oxide layer in a deposition chamber;
   forming a silicon oxime coating on the polysilicon layer in the same deposition chamber; and
   forming a photoresist mask on the silicon oxime coating.

2. The method according to claim 1, wherein the oxide layer is silicon dioxide.

3. The method according to claim 2, comprising: forming the silicon oxide layer to a thickness of about 100 Å to about 200 Å.

4. The method according to claim 1, comprising:
   forming the polysilicon layer to a thickness of about 1200 Å to about 1600 Å.

5. The method according to claim 1, comprising:
   forming the silicon oxime layer to a thickness of about 100 Å to about 600 Å.

6. The method according to claim 1, wherein the silicon oxime layer has an extinction coefficient (k) greater than about 0.4.

7. The method according to claim 1, wherein the silicon oxime layer has a k of about 0.4 to about 0.6.

8. The method according to claim 1, comprising:
   introducing a silicon tetrahydride ($SiH_4$) into a chamber at a temperature greater than about 600° C. to form the polysilicon layer; and
   introducing source gases employing an excess amount of nitrogen gas with remote plasma on into the chamber to form the silicon oxime layer.

9. The method according to claim 1, further comprising:
   patterning the photoresist mask to form a plurality of openings; and
   etching a plurality of corresponding openings in the polysilicon layer and the silicon oxime layer.

10. The method according to claim 1, further comprising:
    etching the silicon oxime layer, the polysilicon layer, and the silicon oxide layer; and
    removing the photoresist mask.

11. The method according to claim 1, further comprising:
    forming dielectric spacers on sidewalls of the gate; and
    forming source/drain regions on either side of the gate by implantation of impurities.

* * * * *